United States Patent
Francis et al.

(10) Patent No.: US 7,534,666 B2
(45) Date of Patent: May 19, 2009

(54) HIGH VOLTAGE NON PUNCH THROUGH IGBT FOR SWITCH MODE POWER SUPPLIES

(75) Inventors: Richard Francis, Manhattan Beach, CA (US); Chiu Ng, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 338 days.

(21) Appl. No.: 11/190,602

(22) Filed: Jul. 27, 2005

(65) Prior Publication Data

US 2007/0026577 A1     Feb. 1, 2007

(51) Int. Cl.
*H01L 21/332*     (2006.01)
(52) U.S. Cl. .................. 438/137; 438/133; 438/904; 257/E21.383
(58) Field of Classification Search .............. 438/133, 438/135, 136, 137, 138, 904
See application file for complete search history.

(56) References Cited

U.S. PATENT DOCUMENTS

| | | | |
|---|---|---|---|
| 6,278,140 B1 * | 8/2001 | Harada et al. ............... 257/133 |
| 6,482,681 B1 * | 11/2002 | Francis et al. ............... 438/138 |
| 6,524,894 B1 * | 2/2003 | Nozaki et al. ............... 438/138 |
| 2007/0231973 A1 | 10/2007 | Ruething et al. | |

OTHER PUBLICATIONS

International Search Report issued Jul. 14, 2008 in corresponding PCT Application No. PCT/US06/28005.
Application of Carrier Lifetime Control by Irradiation to 1.2kV NPT IGBTs, Ralf Siemieniec, Reinhard Herzer, Mario Netzel, Josef Lutz, Proc. 24th International Conference on Microelectronics (Miel 2004), vol. 1.

* cited by examiner

*Primary Examiner*—Alexander G Ghyka
*Assistant Examiner*—Reema Patel
(74) *Attorney, Agent, or Firm*—Ostrolenk, Faber, Gerb & Soffen, LLP

(57) ABSTRACT

A process for forming an NPT IGBT in a thin N type silicon wafer in which the bottom surface of a thin silicon wafer (100 microns thick or less) has a shallow reduced lifetime region in its bottom formed by a light species atom implant to a depth of less than about 2.5 microns. A P$^+$ transparent collector region about 0.5 microns deep is formed in the bottom of the damaged region by a boron implant. A collector contact of Al/Ti/NiV and Ag is sputtered onto the collector region and is annealed at 200° C. to 400° C. for 30 to 60 minutes. A pre-anneal step before applying the collector metal can be carried out in vacuum at 300° C. to 400° C. for 30 to 60 seconds.

12 Claims, 1 Drawing Sheet

HIGH VOLTAGE NON PUNCH THROUGH IGBT FOR SWITCH MODE POWER SUPPLIES

FIELD OF THE INVENTION

This invention relates to Insulated Gate Bipolar Transistors (IGBTs) and more specifically to an IGBT structure and manufacturing process for application to switch mode power supplies (SMPSs).

BACKGROUND OF THE INVENTION

IGBTs are well known. IGBTs can be designed for punch through or non-punch through operation. A known IGBT structure and process for its manufacture for IGBTs used for motor control application employ a non-punch through (NPT) mode of operation in which the device is designed to have a low forward voltage drop ($V_{CEON}$) when the device is conducting, at the expense of an increased turn off energy ($E_{OFF}$).

Such devices are not well adapted to application to switch mode power supplies in which the turn off energy $E_{OFF}$ is to be minimized, even at the expense of a higher $V_{CEON}$.

It would be very desirable to provide a process to produce high voltage (eg. 600 volts) NPT IGBTs with a reduced $E_{OFF}$ which do not require substantial process changes over those normally used for conventional IGBT.

BRIEF DESCRIPTION OF THE INVENTION

In accordance with the present invention a novel NPT IGBT is produced in a thinned wafer (less than about 100μ thick) having a P$^+$ transparent anode (collector) at its bottom, and a novel low lifetime region adjacent the transparent anode to control switching loss. The low lifetime region is formed by an implant of a light atomic species, preferably hydrogen, which has previously been used only for punch through devices.

In a preferred embodiment of the invention, a thinned float zone wafer of N type material, 85 microns thick, has an IGBT junction pattern on its top surface and has a hydrogen implant preferably between about 1E11 to 1E14 into the bottom of the wafer and to a depth, preferably of 1.0 to 2.5 microns to form a damaged reduced lifetime region in the bottom of the wafer. Next, a 0.5 micron P$^+$ transparent anode formed by a boron implant of a dose preferably between 5E13 and 1E12 on the bottom surface.

A metal layer of Al/Ti/NiV/Ag is then sputtered onto the back surface followed by a low temperature anneal (less than 400° C. for 30 to 60 minutes) to remove excess damage caused by the first implant and to enhance the interaction of Al, Si and P type dopant to form the backside junction. The wafers may be preheated in vacuum prior to the Al deposition to help remove implant damage and to better prepare the surface for a strong Al, Si and P dopant interaction.

DETAILED DESCRIPTION OF THE PREFERRED EMBODIMENT

Figure 1:
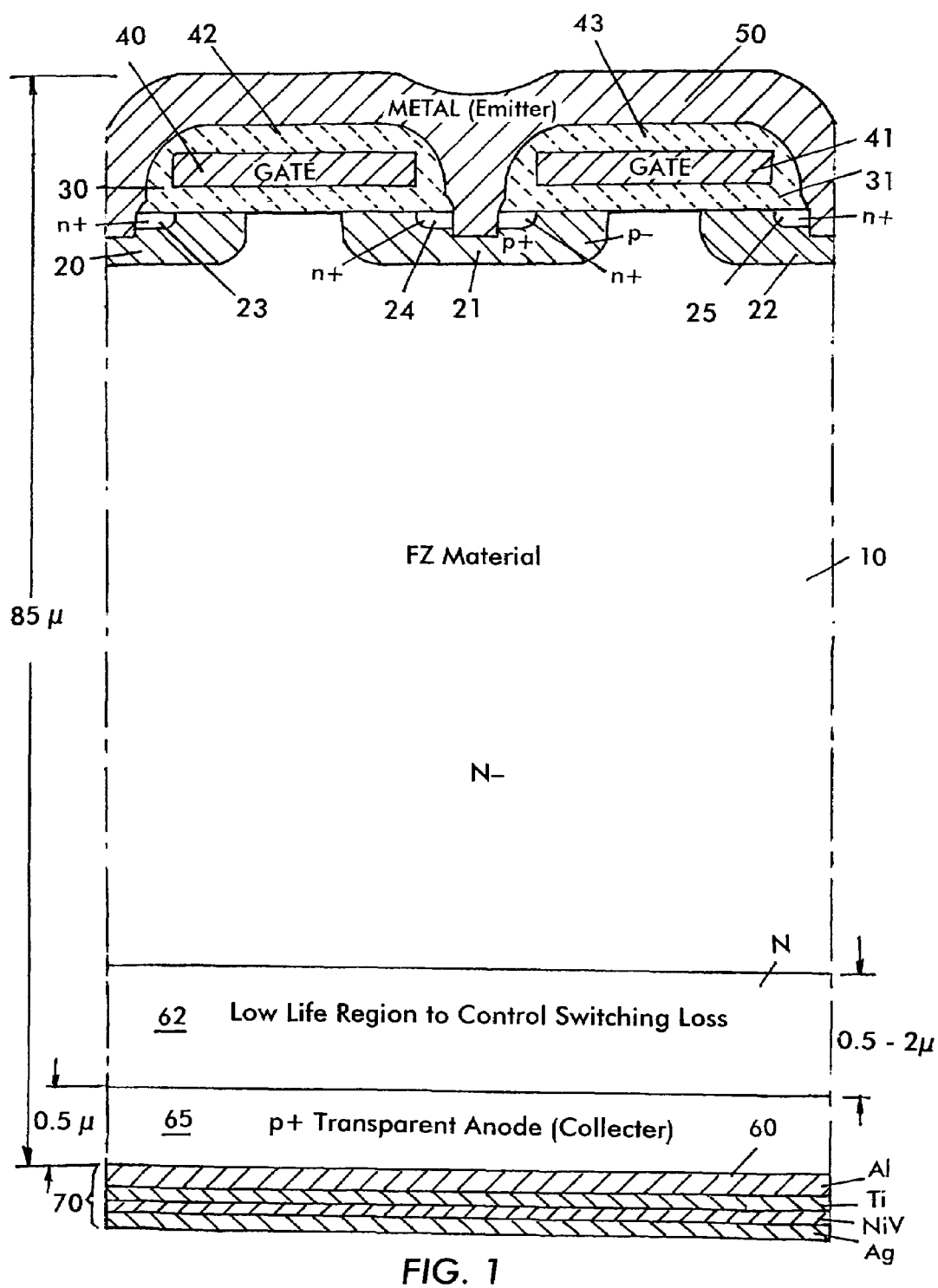
FIG. 1 is a cross-section through an IGBT die (or wafer) showing a small portion (two "cells") of the device.

Referring to FIG. 1, there is shown a small portion of a wafer 10, which will contain a plurality of simultaneously processed die, each of which have identical junction patterns and are singulated after the wafer processing is completed. Wafer 10 is N type float zone material (no epitaxial junction—receiving layer is needed) and can have any desired junction pattern in its top surface.

The wafer is initially conventionally thick, for example, 300 microns thick, so that the upper pattern can be processed with conventional processing equipment.

Thus, spaced base (or channel) regions 20, 21 and 22 are conventionally implanted and diffused into the top surface of wafer 10. These base regions may have conventional P$^+$ bodies to reduce $R_b$, and a P$^{31}$ conductivity in their invertible channel portions to reduce threshold voltage.

Each base region 20, 21 and 22 receives respective N$^+$ source diffusions 23, 24 and 25 which define invertible channel regions which extend within the bases from the edges of the sources to the outer facing edge of the bases. These invertible regions are then covered by conventional gate oxide layers 30, 31 which, in turn, receive polysilicon gate electrodes 40, 41 respectively. An 8 micron poly width is used. (Note that the base regions 20, 21 and 22 are implanted, using the gate poly as a mask pattern.) Gates 40 and 41 are then covered by interlayer oxides 42 and 43 respectively.

A top emitter electrode 50 is then formed above the interlayer oxides, and make contact, in suitable shallow trenches, to the source regions 23, 24, 25 and to the P$^+$ contact regions of bases 20, 21 and 22.

Thereafter, the top surface is protected, as by taping, and wafer is thinned in a known grinding or etch procedure to a thickness of less than about 100 microns, preferably to 85 microns. The bottom surface 60 or anode side of the thinned wafer 10 is then processed in accordance with the invention.

The performance of an NPT IGBT is heavily dependent on the N$^-$ substrate resistivity, its thickness and the injection efficiency of the anode. To achieve desirable breakdown characteristics, the long lifetime N$^-$ substrate needs to be sufficiently wide to confine the depletion layer, which can impact switching performance. The invention forms a low lifetime region in the N$^-$ substrate to improve the switching characteristics of the IGBT. This low lifetime region is formed by implanting a light atomic species, for example, hydrogen or helium to create a damaged layer in the bottom of the silicon wafer. This damaged layer provides recombination centers for the carriers and thus lowers the carrier lifetime. The degree of lifetime reduction is controlled by the implant species, energy, dose, and post implant heating cycles.

Returning to FIG. 1, and, in accordance with a first embodiment of the invention a light species implant, preferably hydrogen with an energy of 100 to 1000KeV and dose of 1E10 to 1E13 is applied to bottom surface 60 to form damaged low lifetime region 62 to a depth of from 1.0 to 2.5 microns. Thereafter, a P$^+$ transparent anode (or collector) region 65 is formed by implanting a P type dopant, preferably boron, with an energy of 40 to 100 KeV and dose of 1E12 to 1E15 into the backside 60 of wafer 10 to a depth of about 0.5 microns.

Thereafter, a collector contact 70 is formed by sequentially sputtering metal layers of Al/Ti/NiV/Ag on the backside of wafer 10. Other metals can be used, as desired. The metal sputtering (or other deposition process) is followed by a 30 to 60 minute anneal at 200° C. to 400° C. This anneal process will remove excessive damage caused by the first hydrogen or other light atomic species implant, and enhances the interaction of the aluminum in contact 70 with the silicon and the P type dopant in region 65 to form the backside junction and contact.

In a second embodiment of the invention, and following the formation of region 65, the wafer 10 is transferred to a backside metal deposition tool and is preheated to 300° C. to 400° C. for 30 to 60 seconds under high vacuum. This is followed by the metal sputtering and anneal of contact 70 as described above. The preheating step under vacuum is useful to remove excess damage caused by the first implant and prepares the silicon surface 60 for strong Al, Si and P type dopant interaction which is critical for anode 65 creation.

The use of the novel processes described above allows the introduction of low lifetime region 62 in the N⁻ wafer 10 and permits the novel control of the $V_{CEON}$ versus switching energy trade-off by varying the two implant doses, their energy and the anneal temperature, and makes it possible to produce an NPT IGBT well adapted to use in a switch node power supply.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A process for the preparation of the backside of an IGBT die; said IGBT comprising a silicon wafer of one of the conductivity types having a top side which contains junctions to define an IGBT and a bottom side which receives an emitter contact, said process comprising the implant of a light species atom into said bottom side to damage the silicon lattice of said wafer to a given depth to define a reduced lifetime region in said wafer for said given depth; and thereafter forming a shallow transparent collector region of the other conductivity type in the bottom of said reduced lifetime region; and thereafter forming a conductive metal contact on said collector region, and thereafter annealing at a temperature below 400° C. to remove damage caused by said implant of said light species.

2. The process of claim 1, wherein said one of the conductivity type is the N type and wherein said wafer has a thickness less than 100 microns.

3. The process of claim 2, wherein said given depth of damage is less than about 2.5 microns and said light species atoms are selected from the groups consisting of hydrogen and helium.

4. The process of claim 3, wherein said transparent collector is formed by a boron implant having a depth of about 0.5 microns.

5. The process of claim 3, wherein said metal contact on said collector region includes an Al layer in contact with the silicon wafer.

6. The process of claim 4, wherein said metal contact on said collector region includes an Al layer in contact with the silicon wafer.

7. The process of claim 5, wherein said annealing is carried out at about 200° C. to 400° C. for about 30 to 60 minutes.

8. The process of claim 6, wherein said annealing is carried out at about 200° C. to 400° C. for about 30 to 60 minutes.

9. The process of claim 3, wherein said implant of said light species has an energy of 100 to 1000 KeV and a dose of 1E12 to 1E15 atoms per cm².

10. The process of claim 8, wherein said implant of said light species has an energy of 100 to 1000 KeV and a dose of 1E12 to 1E15 atoms per cm².

11. The process of claim 1, which further includes an initial anneal step prior to forming said conductive metal contact by heating said die in vacuum at 300° C. to 400° C. for 30 to 60 seconds.

12. The process of claim 10, which further includes an initial anneal step prior to forming said conductive metal contact by heating said die in vacuum at 300° C. to 400° C. for 30 to 60 seconds.

\* \* \* \* \*